United States Patent [19]
Theus

[11] Patent Number: 5,146,225
[45] Date of Patent: Sep. 8, 1992

[54] CMOS CIRCUIT FOR AVERAGING DIGITAL-TO-ANALOG CONVERTERS

[75] Inventor: Ulrich Theus, Gundelfingen, Fed. Rep. of Germany

[73] Assignee: Deutsche ITT Industries GmbH, Freiburg, Fed. Rep. of Germany

[21] Appl. No.: 706,494

[22] Filed: May 28, 1991

[30] Foreign Application Priority Data

Jul. 13, 1990 [EP] European Pat. Off. ........ 90113417.1

[51] Int. Cl.[5] ............................................. H03M 1/82
[52] U.S. Cl. ..................................... 341/152; 341/136
[58] Field of Search ............... 341/135, 136, 143, 144, 341/152

[56] References Cited

U.S. PATENT DOCUMENTS

| | | | |
|---|---|---|---|
| 4,725,813 | 2/1988 | Miyada | 341/136 |
| 4,800,365 | 1/1989 | White et al. | 341/136 |
| 4,947,171 | 8/1990 | Pfeifer et al. | 341/143 |

FOREIGN PATENT DOCUMENTS

0335988 10/1989 European Pat. Off. .

Primary Examiner—Howard L. Williams
Attorney, Agent, or Firm—Thomas L. Peterson

[57] ABSTRACT

A CMOS circuit for averaging digital-to-analog converters includes a shift register of series-connected master and slave cells controlled by a shift clock. The input of the shift register is supplied with a pulse-density-modulated data signal, and the outputs of each of the master and slave cells are connected to a data-dependent control input of a multistage gate circuit. The gate circuits are controlled by a gate clock and cause constant currents to be switched via two buses to the input and output of a p-channel current mirror in accordance with the state of the master or slave cell. The input of a current mirror is constantly supplied with one-half the sum current of the constant-current sources, and the current mirror provides current scaling, preferably by a factor of 0.5.

9 Claims, 2 Drawing Sheets

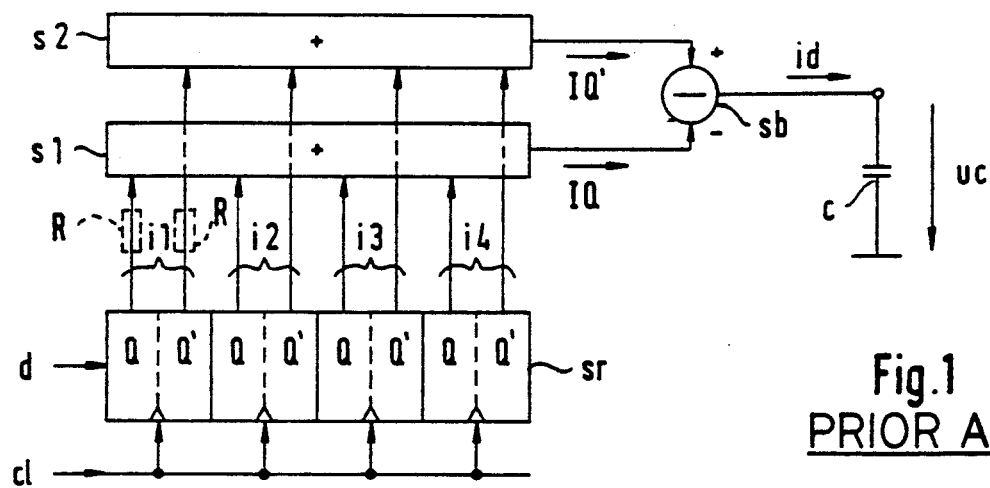
Fig.1 PRIOR ART
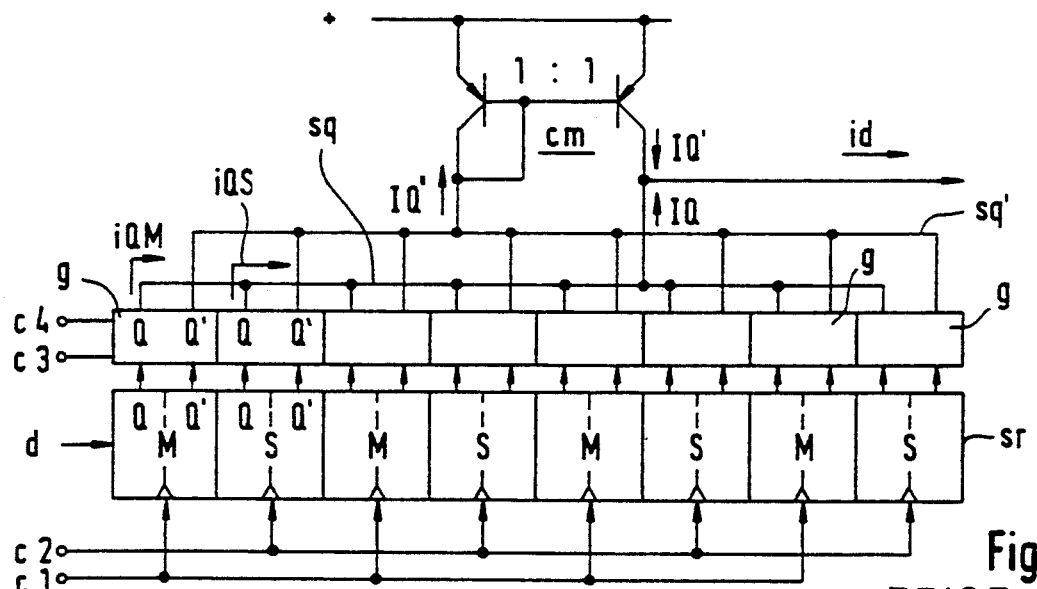
Fig.2 PRIOR ART
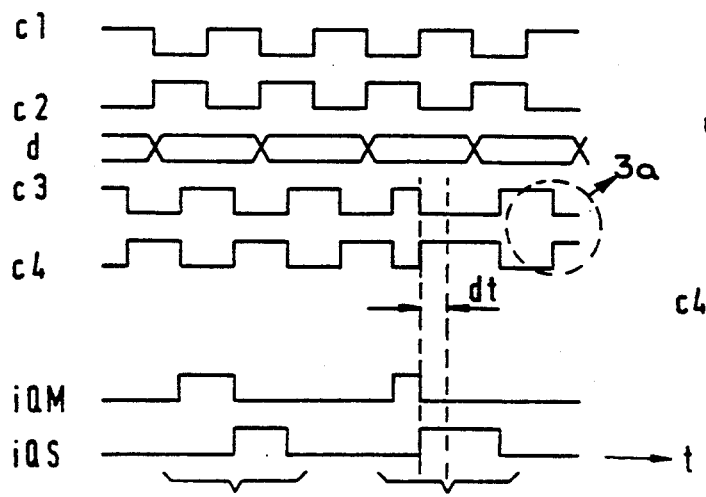
Fig.3
Fig.3a

CMOS CIRCUIT FOR AVERAGING DIGITAL-TO-ANALOG CONVERTERS

BACKGROUND OF THE INVENTION

1. Field of the Invention

The present invention relates to a CMOS circuit for averaging digital-to-analog converters which is used as a sub-circuit for pulse-density digital-to-analog conversion or pulse-density analog-to-digital conversion.

2. Description of the Related Art

In its simplest form, an averaging circuit contains a shift register which is supplied with the pulse-density-modulated signal and whose output signals are combined as current or voltage signals via a summing circuit. The sum output provides the desired averaged signal, which is generally applied as a current signal to a capacitor. Instead of the term "pulse-density modulation," the term "signal-delta modulation" is frequently used.

If both phases of the signals are taken from the individual shift-register cells, the in-phase and out-of-phase components are summed and then the difference of the two sums is formed. The difference represents the desired averaged signal, but not without the constant DC component (See FIG. 1).

Because of the high clock rates of the pulse-density modulated signals, the following circuit or signal characteristics interfere with the averaging:

variations in the instants at which the individual signals change state, which variations may be caused by circuit unbalances, phase jitter, or the data history; and amplitude variations of the individual signals caused by, for example, signal noise or spurious signals.

The effects of circuit unbalances, which may result, for example, in varying leading and trailing edges, and the effects of the data history are prevented by means of gate circuits associated with the shift-register cells. The gate circuits cut a shorter gating interval out of each data interval, so that the averaging is performed with this temporally shortened signal. Each logic 1, irrespective of the data history, represents a separate pulse which starts from the logic 0 level. Thus, asymmetries in the leading and trailing edges can no longer have a disturbing effect, and since each signal begins with a logic 0, the data history is of no consequence, too. Unfortunately, this method, also referred to as "gating," increases the sensitivity to phase jitter, since the phase variations have a greater effect than the shortened gating interval.

According to European Application EP-A-0 335 988 (corresponding to U.S. patent application Ser. No. 321,593), the disadvantageous effects of phase jitter on the gating intervals can be avoided by effecting the gating in both the master phase and the slave phase of the shift clock. To accomplish this, the signals from the Q outputs of all gates are summed and so are the signals from the Q' outputs (see FIG. 2). By the inclusion of the master and slave phases in the gating, the phase variations of the gate clock are compensated for. For instance, if the gating interval in the master phase is too long, the gating interval in the slave phase is automatically correspondingly shorter, as shown, for example, in FIG. 3. Clock sensitivity is an essential prerequisite for high-resolution converters.

The EP-A-0 335 988 application further describes how the amplitudes of the individual signals can be made more uniform by using a separate signal source for each signal. The logic states of the master and slave cells and the gate signal control only the signal path in the respective gate circuit for the separate signal source. Each gate circuit contains two electronic switches in series. The first electronic switch connects the signal source to the neutral gate output outside the gating interval or to the input of the second electronic switch during the gating interval. The first electronic switch is controlled via a clock-dependent control input to which the gate signal is applied. The second electronic switch is controlled via a data-dependent control input which is connected to the Q (true) and Q' (complement) outputs of the associated master or slave cell. The two output terminals of the second electronic switch form the Q and Q' terminals of the gate circuit.

Since currents are easy to switch and sum, all signal sources are implemented with separate constant-current sources which are all connected to a common bias source. All Q' terminals of the gate circuits are coupled to a common first bus which is connected to the input of a current mirror serving as a current-difference stage. Similarly, all Q terminals of the gate circuits are coupled to a common second bus which is connected to the output of the current mirror and from whose node the differential current can be taken. All neutral gate terminals are combined via a gate bus which is connected to a neutral current sink.

The gate clock is synchronous with the shift clock but differs in phase from the latter by a certain amount for reliable data transfer. Thus, (1) all slave cells are connected to either the current-difference stage or the neutral current sink while all master cells are connected to the neutral current sink, or (2) all master cells are connected to either the current-difference stage or the neutral current sink while all slave cells are connected to the neutral current sink.

The current difference is formed in the EP-A-0 335 988 application by means of a pnp-transistor current mirror whose input and output are connected to the Q bus and the Q' bus, respectively. From the Q' bus, the differential current can be taken as an averaging signal, as shown, for example, in FIG. 2.

It is not readily possible to convert this prior art circuit arrangement, which is implemented in bipolar technology, to CMOS technology, particularly for high clock rates. And this applies even though MOS transistors, in contrast to bipolar transistors, have an ideal current ratio, because no base current has to be taken out of the transmitted current. The main disadvantage of MOS transistors is their square-law current characteristic $$I_{DS} - \beta(U_{GS} - U_T)^2$$

and their relatively large gate-source capacitance. This has an extremely disadvantageous effect in MOS currents mirrors if high-frequency current have to be mirrored. In that case, part of the input current is used to reverse the charge of the gate-source capacitances of the current-mirror transistors. Since the gate-source voltage is proportional to the root of the drain current, and the gate current is proportional to the change in gate-source voltage, the drain current of the output transistor of the current mirror is distorted, the distribution increasing with increasing frequency. In the case of pulse-density-modulated signals with their high clock frequencies, these distortions fall into the useful-signal band through signal mixing.

SUMMARY OF THE INVENTION

Accordingly, the problem to be solved by the invention as claimed is to provide a CMOS circuit for averaging digital-to-analog converters which avoids the above-described disadvantages of the MOS current mirror.

Besides the actual solution to the problem, a further advantage gained by the invention is that the circuit is insensitive to the 1/f noise of the individual MOS current sources and to the low-frequency noise of the current-source reference voltage.

BRIEF DESCRIPTION OF THE DRAWINGS

The invention will now be explained in more detail with reference to the accompanying drawings, in which:

FIG. 1 is a block diagram of a prior art circuit for averaging pulse-density-modulated signals;

FIG. 2 is a block diagram of a prior art improvement of the circuit of FIG. 1;

FIG. 3 is a timing diagram for the circuit of FIG. 2; and

FIG. 3a is an enlarged view of the circled portion of FIG. 3.

DETAILED DESCRIPTION OF THE PREFERRED EMBODIMENT

Figure 4:
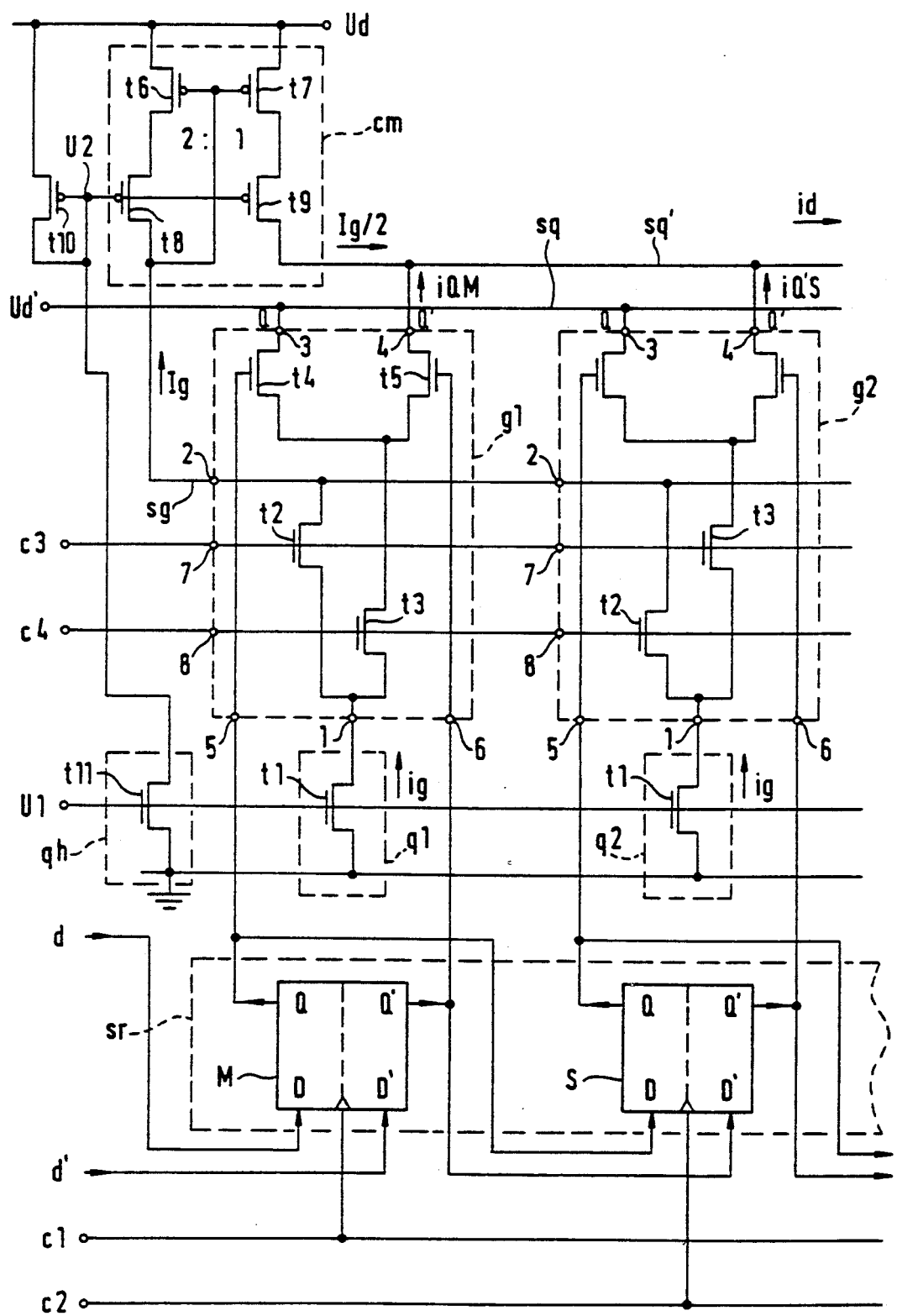
FIG. 4 is a circuit diagram of a preferred embodiment of the invention.

FIG. 1 shows a simple, known embodiment of an averaging digital-to-analog converter with a four-stage shift register sr, whose serial input is supplied with a data signal d, a pulse-density-modulated signal in the binary code. The Q (true) and Q' (complement) outputs of all shift-register cells are connected to a first summer s1 and a second summer s2, respectively. From the output potential of the respective cell, the respective data-dependent cell current i1, i2, i3, i4 can be derived by means of a resistor R (shown by a dashed line). The outputs of the two summers s1 and s2 are coupled to a subtracter sb, which forms a differential current id. This differential current serves as an averaging output signal, for its value is proportional to the average value of four successive logic states of the data signal d.

As a rule, the differential current id is integrated by means of a capacitor c, across which the capacitor voltage uc appears as an integral output signal. The two summers s1 and s2 and the subtracter sb may also be adapted to the processing of voltage signals, of course. The shift register sr is controlled by a clock signal c1 whose pulse rate is equal to the bit rate of the data signal d.

FIG. 2 shows an improved embodiment which is known from EP-A-0 335 988. The shift register sr is divided into successive master and slave cells M and S. The master and slave cells are controlled by a first shift clock c1 and a second shift clock c2, respectively, the two shift clocks forming a two-phase clock which is generally nonoverlapping. Through the use of the Q and Q' outputs of the master and slave cells M and S, the number of signals involved in the averaging is twice that in FIG. 1.

Each master cell M and each slave cell S has a gate circuit g associated with it which has a data-dependent control input that is connected to the Q and Q' outputs of the respective shift-register cell. Each gate circuit g further has a clock-dependent control input to which is applied to an overlapping two-phase clock consisting of a first gate clock c3 and a second gate clock, c4 of the same frequency as the two shift clocks, c1 and c2. The two gate clocks are phase-delayed with respect to the two shift clocks, so that the gating interval does not fall into the shift phase.

The Q outputs of all gate circuits g are connected to a Q bus sq, and the Q' outputs are connected to a Q' bus sq'. For clarity, FIG. 2 does not show that each gate circuit g has a separate constant-current source associated with it whose current is transferred either to the Q or Q' gate output or to a neutral gate output depending on the position of the gate. These neutral gate outputs are connected via a gate bus sq (see, for example, FIG. 4) to a positive supply terminal serving as a neutral current sink.

The Q' sum current IQ' feeds the input of a current mirror cm consisting of two identical pnp transistors. The output terminal of this current mirror cm is connected to the Q bus sq, so that the difference between the Q' sum current IQ' and the Q sum current IQ is formed at the node. From this node, which is identical with the Q bus sq, the differential current id can thus be taken as an output signal.

For the two gate clocks c3 and c4, it is important that throughout the transfer operation the division of the respective constant current is invariant in its sum. To make the current integrals depending on the two gate clocks c3 and c4 as equal as possible, the current division caused by the two transition edges must be symmetrical about the transition point E (as shown, for example, in FIG. 3) and the current must be halved at the transition point E. This determines the geometry, variation with time, and phase position of the transition edges.

For the averaging, it may also be of interest if the constant currents are not equal, but weighted. An advantageous weighting is a symmetrical weighting starting from the middle of the shift register sr and decreasing toward the outside. A triangular weighting is particularly advantageous. However, master and slave cells M and S associated with one another from the point of view of mirror symmetry must not show any differences in weighting. For example, the first master cell and the last slave cell of the shift register sr belong together from the point of view of mirror symmetry.

The compensation for the phase jitter caused by the gate circuits connected to the master and slave cells M and S will now be explained in more detail with the aid of the timing diagram of FIG. 3.

In FIG. 3, the first and second lines show the first shift clock c1 and the inverted second shift clock c2, whose clock rates are identical with the bit rate of the data signal d, which is shown in the third line. The active (positive) phase of the first shift clock c1, which controls the master cell M, does not begin until the data signal d has reached a stable state. By the active (positive) phase of the first gate clock c3, shown in the fourth line, all gate circuits g associated with the master cells M are connected to the current-difference stage, and by the active (positive) phase of the second gate clock c4, shown in the fifth line, all gate circuits g associated with the slave cells S are connected to the current-difference stage. Substitutionally for all output currents, the Q output current iQM associated with the first master cell M is shown in the sixth line of FIG. 3, and the Q output current iQS associated with the first slave cell S is shown in the seventh line.

In region B, the gate clocks c3 and c4 are not disturbed, while in region H, the instant at which the first and second gate clocks c3 and c4 change state is falsified by the time interval dt. Correspondingly, the Q output current iQM in the master portion is shortened by the time interval dt, and the Q output current iQS in the slave portion is prolonged by the same time interval dt. Through the summation of the two Q output currents, however, the total time of current flow does not change, so that the phase error has no effect on the subsequent averaging.

The transition region of the first and second gate signals c3 and c4, shown schematically as square-wave signals in FIG. 3, is illustrated in greater detail beside the schematic waveforms in FIG. 3A. The two transition edges intersect at a transition point E, which also determines the axis of symmetry s for the current division. The overlap and, hence, the position of the transition point E must ensure that only a division of the constant current, and no attenuation or even suppression, takes place.

The partial circuit diagram of the preferred embodiment of the invention shown in FIG. 4 contains many of the basic elements of FIGS. 1 or 2, which are designated by like reference characters. Therefore, they need not be described in detail again. Of the entire shift-register arrangement sr, only the first master cell M and the first slave cell S with associated first and second gate circuits g1 and g2 are shown in FIG. 4. The data signal d is applied as antiphase signals d and d' to the D (true) and D' (complement) inputs, respectively of a first D flip-flop serving as a master cell M. Connected to this first D flip-flop is a second D flip-flop serving as a slave cell S, and so on. The clock inputs of the master and slave cells are connected to the first and second shift clocks c1 and c2, respectively, which form a two-phase clock.

The master cell M has a first constant-current source q1 associated with it which generates a constant current iq by means of an n-channel transistor t1 and a current-source reference potential U1. This constant current iq is supplied to a terminal 1 of the first gate circuit g1 and is transferred either to a first gate output terminal 2—or to a second or third gate output terminal 3 or 4—by means of the n-channel transistor t2 or t3, respectively, which transistors serve as gate switches. The terminals 3 and 4 are the Q output and the Q' outputs, respectively, of the first gate circuit g1. The terminal 2 is also called the "neutral gate output," since the opening of this gate output is dependent only on the gate clock, not on the data signal d.

The terminals 4 and 4 are coupled to the drain terminals of an n-channel transistor pair t4, t5, which serve as a second gate switch. Its common source terminal is connected to the drain terminal of the transistor t3. The gate terminals of the transistors t4 and t5 form the terminals 5 and 6, respectively, of the first gate circuit g1, which are connected to the Q and Q' outputs, respectively, of the master cell M. The terminals 5 and 6 thus form the data-dependent control input of the first gate circuit g1.

The gate terminals of the transistors t2 and t3 form the terminals 7 and 8, respectively, of the first gate circuit g1 and are supplied with the first and second gate signals c3 and c4, respectively. The terminals 7 and 8 thus form the clock-dependent control input of the first gate circuit g1. The n-channel transistors t2–t5 switch the constant current iq to one of the three gate outputs, terminal 2 or 3 or 4.

The internal and external wiring of the second gate circuit g2, which is associated with the slave cell S, is identical to that of the first gate circuit g1 except for the drive circuitry of the n-channel transistors t2 and t3. In the second gate circuit g2, the gate terminals of the n-channel transistors t2 and t3 are connected to the terminals 8 and 7, respectively, of the second gate circuit g2 and are thus supplied with the second and first gate clocks c4 and c3, respectively. The interconnected terminals 2 of all gate circuits form a gate bus sg which is connected to the input of a current mirror cm consisting of p-channel transistors t6 to t9. The interconnected terminals 4 of all gate circuits form a Q' bus sq' which is connected to the output terminal of the current mirror cm for forming the different current. The current mirror cm has a current scaling factor of preferably 0.5. The terminals 3 of all gate circuits are coupled to a Q bus sq which is connected to an arbitrary positive supply potential Ud' serving as a current sink. The sum current on this bus sq is not used for forming the differential current id.

The essential advantage of this arrangement is that the current mirror cm sees at its input a constant sum current Ig which is just as large as one-half the sum current of all constant-current sources q1, q2, . . . . Consequently, the mirrored current Ig/2 is a constant current, too. From this current-mirror output current Ig/2, depending on the clock phase, the data-dependent Q' output currents iQ'M or iQ'S of the master or slave sections are subtracted. As a resultant signal, the differential current id can be taken from the Q' bus sq'.

The current scaling factor is determined by the data reference level at which the differential current id is to become zero. The ratio formed by the range of values of the data signal d below this data reference level and the total range of values represents the current scaling factor. A commonly symmetrical range of values gives the current scaling factor 0.5.

By loading the current-mirror output with a DC offset current, an asymmetry of the ranges of values may be forced, which must be taken into account in the current scaling factor. In the limiting case, the current mirror cm provides no current scaling at all, for example, if the DC offset current is equal to half the sum current Ig/2 and the data reference level lies in the middle of the total range of values.

A particular advantage of the circuit of FIG. 4 is that the disturbing 1/f noise of the n-channel sources q1, q2, . . . is reduced, because the noise of the sum current Ig is determined by the total gate area of all n-channel constant-current source transistors t1. Low-frequency noise components beat with the sum current Ig but also with the Q' output currents iQ'M and iQ'S of the gate circuits g1 and g2 and, therefore, partially compensate each other. The effect of the compensation is drive-dependent. The resulting 1/f noise component is directly proportional to the magnitude of the differential current id. For audio signals this is of great advantage, since the noise is then less perceptible. Similarly, low-frequency noise of the current-source reference potential U1 is compensated by the joint effect on the constant-current source sum current and the mirrored current. The contribution of the p-channel current mirror cm to the noise is small in comparison with the contribution of the constant-current sources q1, q2, . . . . The above-described compensation of the 1/f noise presupposes that the bit rate is very high compared with the frequency range of the 1/f noise.

The current mirror cm includes a p-channel cascode transistor t8 at the input and a p-channel cascode transistor t9 at the output. The gate terminals of these transistors are connected to a gate reference potential U2. The latter is formed by a diode-connected p-channel transistor t10 whose common gate-source terminal is supplied with a constant current from an auxiliary constant-current source qh. This auxiliary constant-current source qh is formed by an n-channel transistor t11 whose gate terminal is connected to the current-source reference potential U1. The bottom end of the current mirror cm, which is formed by the source terminals of the transistors t6 and t7, and the source terminal of the transistor t10 are tied to the positive supply potential Ud.

The drive range of the differential current id is $+/-(Ig/2)$, i.e., twice that of the output current $Ig/2$ of the current mirror cm. If the current mirror cm is provided with an additional output which also delivers the current $Ig/2$, this terminal can be used together with the Q bus sq to form an inverted differential current.

What is claimed is:

1. A CMOS circuit for averaging digital-to-analog converters that receives a pulse-density modulated data signal and provides an averaged output signal, comprising:
   a shift register comprising alternately series-connected master and slave cells, each cell having a true data output and a complementary data output, said shift register controlled by a shift clock, said shift register having a serial input that receives said pulse-density-modulated data signal, each master cell and each slave cell having associated therewith
   a respective constant-current source; and
   a respective gate circuit, each gate circuit having an input, a true output, a complement output, a neutral output, a data-dependent control input and a clock-dependent control input, said constant-current source being electrically connected through said gate circuit from said input to a selected one of said three outputs depending on a signal applied to said data-dependent control input, said data-dependent control input of said gate circuit being connected to the true and complement outputs of the respective master or slave cell, said clock-dependent control input of said gate circuit being supplied with a gate clock,
   a true bus connected to the true outputs of said gate circuits;
   a complement bus connected to the complement outputs of said gate circuits;
   a gate bus connected to the neutral outputs of said gate circuits; and
   a current mirror having an input and an output, said input connected to said gate bus, and said output connected to one of said true bus and said complement bus, said input and said output forming a differential current as said output signal of said CMOS circuit, said current mirror having a defined current scaling factor such that the value of the differential current is zero at the data reference level of the data signal.

2. A CMOS circuit as defined in claim 1, wherein said current mirror comprises a plurality of p-channel transistors, and wherein each of said constant-current sources comprises at least one n-channel transistor.

3. A CMOS circuit as defined in claim 2, further including a current-source reference potential, and wherein each constant current-source comprises at least one current-determining n-channel transistor having a gate terminal, the gate terminal of each current-determining n-channel transistor of each constant-current sources being connected to said current-source reference potential.

4. A CMOS circuit as defined in claim 1, wherein said constant-current sources are weighted, with the weighting decreasing from the middle of the shift register toward the outside in a mirror-symmetrical manner, and wherein master and slave cells belonging together from the point of view of mirror symmetry exhibit no differences in weighting.

5. A CMOS circuit as defined in claim 4, wherein the weighting of the constant-current sources has a triangular characteristic.

6. A CMOS circuit as defined in claim 1, wherein said current mirror comprises a p-channel cascode transistor at said input and a p-channel cascode transistor at said output.

7. A CMOS circuit for averaging digital-to-analog converters that receives a pulse-density modulated data signal and provides an averaged output signal, comprising:
   a shift register comprising alternately series-connected master and slave cells, each cell having a true data output and a complementary data output, said shift register controlled by a shift clock, said shift register having a serial input that receives said pulse-density-modulated data signal, each master cell and each slave cell having associated therewith:
   a respective constant-current source; and
   a respective gate circuit, each gate circuit having an input, a true output, a complement output, a neutral output, a data-dependent control input and a clock-dependent control input, said constant-current source being electrically connected through said gate circuit from said input to a selected one of said three outputs depending on a signal applied to said data-dependent control input, said data-dependent control input of said gate circuit being connected to the true and complement outputs of the respective master or slave cell, said clock-dependent control input of said gate circuit being supplied with a gate clock,
   a true bus connected to the true outputs of said gate circuits;
   a complement bus connected to the complement outputs of said gate circuits;
   a gate bus connected to the neutral outputs of said gate circuits;
   a current mirror having an input and an output, said input connected to said gate bus, and said output connected to one of said true bus and said complement bus, said input and said output forming a differential current as said output signal of said CMOS circuit, said current mirror having a defined current scaling factor such that the value of the differential current is zero at the data reference level of the data signal, said current mirror comprising a p-channel cascode transistor at said input and a p-channel cascode transistor at said output; and
   an auxiliary constant-current source and a diode-connected p-channel transistor, said p-channel having a source terminal at the same potential as the bottom end of the current mirror, said auxiliary constant-current source and diode-connected p-channel transistor establishing a gate reference potential, wherein the gate terminals of said p-channel cascode transistors are connected to said gate reference potential.

8. A CMOS circuit for averaging digital-to-analog converters that receives a pulse-density modulated data signal and provides an averaged output signal, comprising:
  a shift register comprising alternately series-connected master and slave cells, each cell having a true data output and a complementary data output, said shift register controlled by a shift clock, said shift register having a serial input that receives said pulse-density-modulated data signal, each master cell and each slave cell having associated therewith:
    a respective constant-current source; and
    a respective gate circuit, each gate circuit having an input, a true output, a complement output, a neutral output, a data-dependent control input and a clock-dependent control input, said constant-current source being electrically connected through said gate circuit from said input to a selected one of said three outputs depending on a signal applied to said data-dependent control input, said data-dependent control input of said gate circuit being connected to the true and complement outputs of the respective master or slave cell, said clock-dependent control input of said gate circuit being supplied with a gate clock,
  a true bus connected to the true outputs of said gate circuits;
  a complement bus connected to the complement outputs of said gate circuits;
  a gate bus connected to the neutral outputs of said gate circuits; and
  a current mirror having an input and an output, said input connected to said gate bus, and said output connected to one of said true bus and said complement bus, said input and said output forming a differential current as said output signal of said CMOS circuit, said current mirror having a defined current scaling factor such that the value of the differential current is zero at the data reference level of the data signal,
wherein:
  said shift clock is a two-phase clock comprising a first shift clock and a second shift clock;
  said gate clock in an overlapping two-phase clock comprising a first gate clock and a second gate clock; and
  the transition edges of said first and second gate clocks are adjusted in their variation with time and in their phase position so that:
    the current division in the respective gate circuit is always invariant in its sum;
    the current division caused by the two transition edges is symmetrical about a transition point; and
    the current from the constant-current source is divided into two equal parts at said transition point.

9. A CMOS circuit as defined in claim 1, wherein said current mirror has a current scaling factor of 0.5.

* * * * *